(12) United States Patent
Yang et al.

(10) Patent No.: US 11,980,047 B2
(45) Date of Patent: May 7, 2024

(54) DISPLAY PANEL AND DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Pengcheng Lu, Beijing (CN); Hui Wang, Beijing (CN); Yanming Wang, Beijing (CN); Yage Song, Beijing (CN); Jiantong Li, Beijing (CN); Kuanta Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 696 days.

(21) Appl. No.: 17/259,238

(22) PCT Filed: Mar. 27, 2020

(86) PCT No.: PCT/CN2020/081880
§ 371 (c)(1),
(2) Date: Jan. 11, 2021

(87) PCT Pub. No.: WO2021/189495
PCT Pub. Date: Sep. 30, 2021

(65) Prior Publication Data
US 2022/0140277 A1    May 5, 2022

(51) Int. Cl.
*H10K 50/824* (2023.01)
*H10K 59/122* (2023.01)
*H10K 59/131* (2023.01)

(52) U.S. Cl.
CPC ......... *H10K 50/824* (2023.02); *H10K 59/122* (2023.02); *H10K 59/131* (2023.02)

(58) Field of Classification Search
CPC .. H10K 50/824; H10K 59/122; H10K 59/131; H10K 59/123; H10K 59/80515;
(Continued)

(56) References Cited

U.S. PATENT DOCUMENTS 7,501,303 B2    3/2009  Unlu et al.
11,282,913 B2 *  3/2022  Wang ................... H10K 59/124
(Continued)

FOREIGN PATENT DOCUMENTS

CN    101211077 A    7/2008
CN    100576044 C    12/2009
(Continued)

OTHER PUBLICATIONS

Extended European Search Report for EP Patent Application No. 20900713.7 dated Apr. 4, 2023.
(Continued)

*Primary Examiner* — Mohammad A Rahman
(74) *Attorney, Agent, or Firm* — Perilla Knox & Hildebrandt LLP; Kenneth A. Knox

(57) ABSTRACT

A display panel includes a driving back plate, a first insulating layer, and a light-emitting device layer sequentially stacked. The driving back plate includes a first reflecting electrode layer. The first reflecting electrode layer includes first primary reflecting electrodes in a display area and first auxiliary reflecting electrodes in a peripheral area. The light-emitting device layer includes a second reflecting electrode layer including second primary reflecting electrodes in the display area and second auxiliary reflecting electrodes in the peripheral area. The second primary reflecting electrodes are in one-to-one correspondence and electrically connected with the first primary reflecting electrodes. The orthographic projection of the second primary
(Continued)

reflecting electrode on the first reflecting electrode layer are located within the first primary reflecting electrode.

27 Claims, 8 Drawing Sheets

(58) Field of Classification Search
 CPC ........... H10K 59/80518; H10K 50/865; H10K 2102/3026; H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00
 See application file for complete search history.

(56) References Cited

U.S. PATENT DOCUMENTS

| | | |
|---|---|---|
| 2004/0169245 A1 | 9/2004 | Unlu et al. |
| 2016/0351851 A1 | 12/2016 | Lee et al. |
| 2017/0054113 A1 | 2/2017 | Lee et al. |
| 2018/0122877 A1 | 5/2018 | Beak et al. |
| 2018/0190944 A1 | 7/2018 | Lee et al. |
| 2020/0243625 A1 | 7/2020 | Beak et al. |
| 2021/0091152 A1 | 3/2021 | Yang et al. |

FOREIGN PATENT DOCUMENTS

| | | |
|---|---|---|
| CN | 110459699 A | 11/2019 |
| CN | 110473895 A | 11/2019 |
| CN | 110610975 A | 12/2019 |
| JP | 2019179716 A | 10/2019 |
| WO | 2019214590 A1 | 11/2019 |

OTHER PUBLICATIONS

Written Opinion for International Application No. PCT/CN2020/081880 dated Dec. 29, 2020.

\* cited by examiner

DISPLAY PANEL AND DISPLAY DEVICE

CROSS-REFERENCE TO RELATED APPLICATIONS

This application is a national phase application under 35 U.S.C. 371 of International Application No. PCT/CN2020/081880 filed Mar. 27, 2020, the contents of which being incorporated by reference in their entirety herein.

TECHNICAL FIELD

This disclosure relates to the technical field of display and, in particular, to a display panel and a display device.

BACKGROUND

Compared with DMD (digital micro mirror device) and LCOS (liquid crystal on silicon) micro-displays, silicon-based OLED micro-displays possess extremely excellent display characteristics. OLED provides excellent user experience because of high brightness, rich colors, low driving voltage, fast response speed, low power consumption. And, OLED is an all-solid-state device with good anti-seismic performance and wide working temperature range (−40° C.~85° C.). OLED is of a self-luminous device, does not need a backlight source, has a wide view angle range and a thin thickness to reduce a system volume profitably, and especially adapt to a near-eye display system.

In the near-eye display system, the brightness of the display screen is a key indicator. For example, in AR (augmented reality) products, the micro-display may be a high-brightness screen, in order to adjust the brightness thereof according to different work environments and scenes such that the display brightness may be matched with a sensual experience of human eyes.

Those contents as disclosed in the Background portion are merely used to reinforce understanding of the background technology of the present disclosure, accordingly the Background portion may include information that does not constitute the related art as already known by an ordinary person skilled in the art.

SUMMARY

According to a first aspect of the present disclosure, a display panel is provided. The display panel includes a display area and a peripheral area surrounding the display area. The display panel includes:
  a driving back plate comprising a driving circuit layer and a first reflecting electrode layer arranged in a stacked manner; the first reflecting electrode layer comprising a plurality of first primary reflecting electrodes in the display area and a plurality of first auxiliary reflecting electrodes in the peripheral area; and the plurality of the first primary reflecting electrodes being electrically connected with the driving circuit layer;
  a first insulating layer on a side of the first reflecting electrode layer away from the driving circuit layer;
  a light-emitting device layer on a side of the first insulating layer away from the driving circuit layer and comprising a second reflecting electrode layer, an organic light-emitting layer and a common electrode layer sequentially stacked on a side of the first insulating layer away from the driving circuit layer; wherein the second reflecting electrode layer comprises a plurality of second primary reflecting electrodes in the display area and a plurality of second auxiliary reflecting electrodes in the peripheral area;
  wherein the plurality of the second primary reflecting electrodes are in one-to-one correspondence with and electrically connected with the first primary reflecting electrodes; and
  wherein an orthographic projection of the second primary reflecting electrode on the first reflecting electrode layer is within the first primary reflecting electrode.

According to a second aspect of the present disclosure, a display device includes the display panel according to present disclosure.

BRIEF DESCRIPTION OF THE DRAWINGS

The above-described and other features and advantages of the present disclosure will become more apparent from the detailed descriptions of exemplary embodiments with reference with the accompanying drawings.

DETAILED DESCRIPTION

Figure 1:
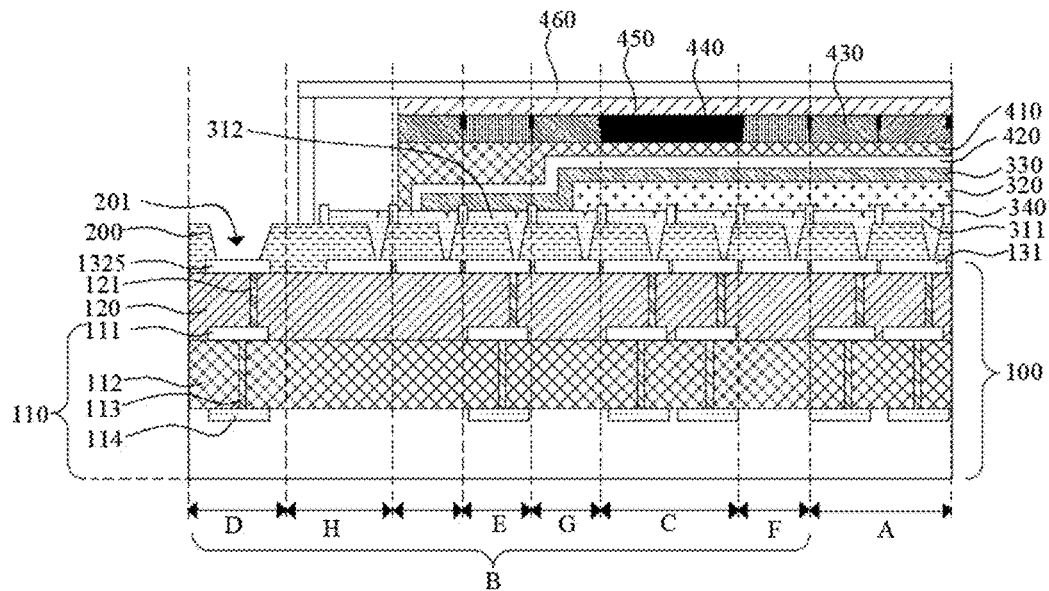
FIG. 1 is a schematic structural cross-sectional view of the display panel according to an embodiment of the present disclosure.

Now, the exemplary implementations will be described more completely with reference to the accompanying drawings. However, the exemplary implementations may be done in various forms and should not be construed as limiting the implementations as set forth herein. Instead, these implementations are provided so that the present disclosure will be thorough and complete, and concept of the exemplary implementation will be fully conveyed to those skilled in the art. The above-described features, structures or characteristics may be combined in one or more embodiments in any appropriate way. In the following description, many specific details are provided for fully understanding embodiments of the present disclosure.

In the drawings, the thickness of an area and a layer may be exaggerated for clarity. Same reference numbers denote the same or similar structures in the figures, and thus the detailed description thereof will be omitted.

The above-described features, structures or characteristics may be combined in one or more embodiments in any appropriate way. In the following description, many specific details are provided for fully understanding embodiments of the present disclosure. However, it will be recognized by those skilled in the art that technical solutions of the present disclosure may be practiced without one or more of the specific omitted details, or using other methods, components, and materials. In some other cases, well-known structures, materials, or operations will not be illustrated or described in detail to avoid obscuration of main technical ideas of the present disclosure.

When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the" and "said" are used herein to indicate the presence of one or more elements/component parts/and others. Terms "including" and "having" have an inclusive meaning, which means that there may be additional elements/component parts/and others in addition to the listed elements/component parts/and others. Terms "first", "second", "third", and "fourth" are used herein only as markers, and they do not limit the number of objects modified after them.

In this disclosure, the distance between two structures refers to the minimum value of the distance between any point on one structure and any point on the other structure.

Figure 2:
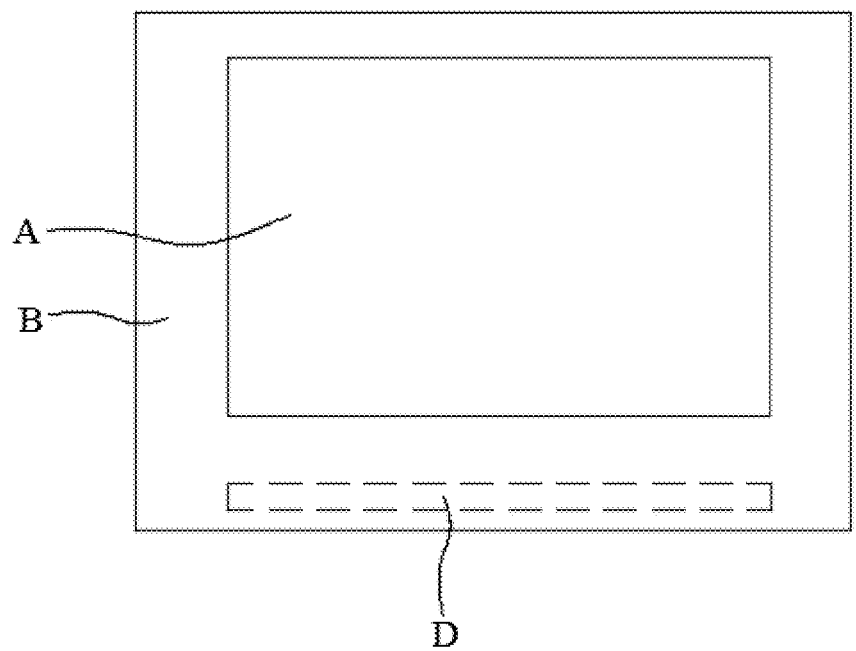
FIG. 2 is a schematic structural view of the display panel according to an embodiment of the present disclosure.

The present disclosure provides a display panel, as shown in FIGS. 1 and 2. The display panel includes a display area A and a peripheral area B surrounding the display area A. The display panel also includes a driving back plate 100, a first insulating layer 200, and a light-emitting device layer.

Figure 14:
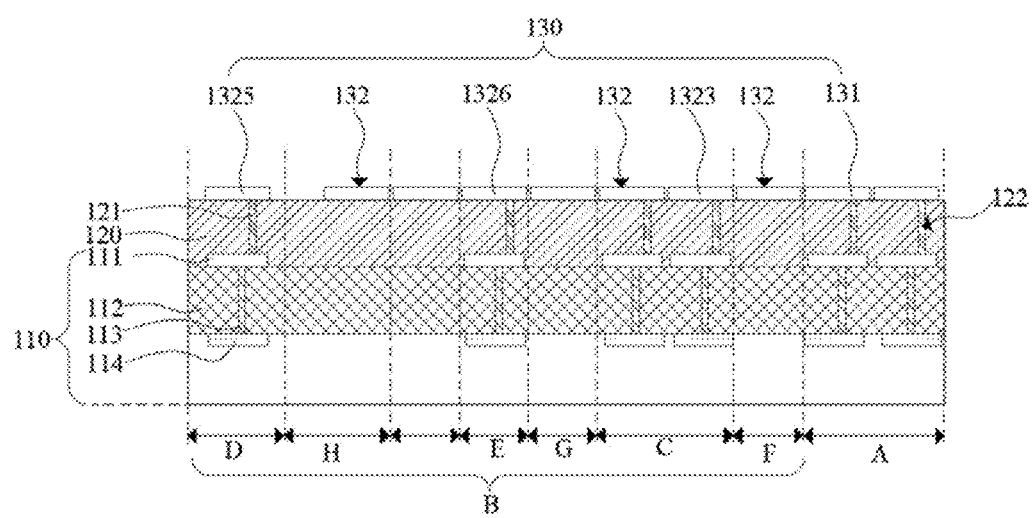
FIG. 14 is a schematic structural view of a first reflecting electrode layer according to an embodiment of the present disclosure.
Figure 15:
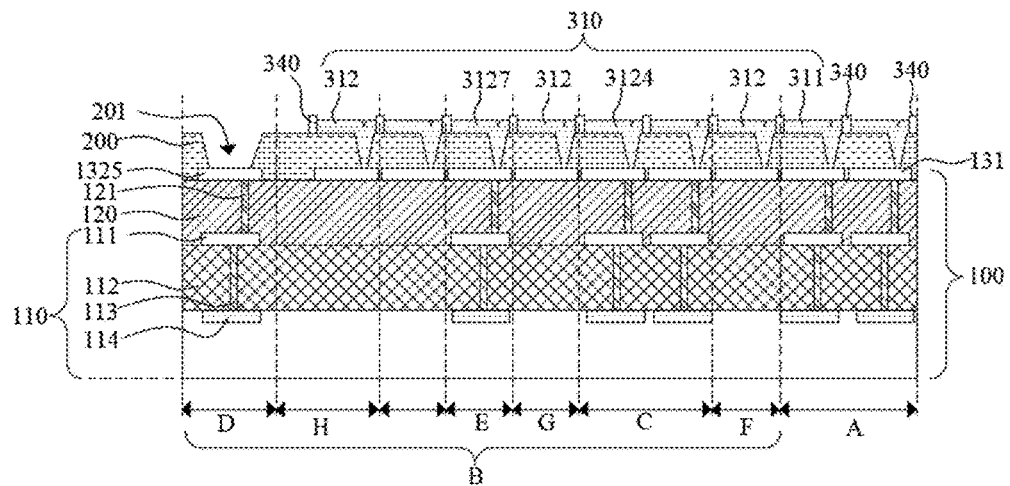
FIG. 15 is a schematic structural view of a second reflecting electrode layer according to an embodiment of the present disclosure.

As shown in FIG. 14, the driving back plate 100 includes a driving circuit layer 110 and a first reflecting electrode layer 130 which are stacked. The first reflecting electrode layer 130 includes a plurality of first primary reflecting electrodes 131 located in a display area A and a plurality of first auxiliary reflecting electrodes 132 located in a peripheral area B, and the respective first primary reflecting electrodes 131 are electrically connected with the driving circuit layer 110. The first insulating layer 200 is disposed on the side of the first reflecting electrode layer 130 away from the driving circuit layer 110. As shown in FIG. 1 and FIG. 15, the light-emitting device layer is arranged on the side of the first insulating layer 200 away from the driving circuit layer 110, and includes a second reflecting electrode layer 310, an organic light-emitting layer 320, and a common electrode layer 330 which are sequentially stacked on the side of the first insulating layer 200 away from the driving circuit layer. The second reflecting electrode layer 310 includes a plurality of second primary reflecting electrodes 311 located in the display area A and a plurality of second auxiliary reflecting electrodes 312 located in the peripheral area B. The second primary reflecting electrodes 311 are electrically connected with the first primary reflecting electrodes 131 in one-to-one correspondence. Further, orthographic projections of the second primary reflecting electrodes 311 on the first reflecting electrode layer 130 are within the first primary reflecting electrodes 131 corresponding thereto.

In the display panel provided by the present disclosure, the first reflecting electrode layer 130 includes a plurality of first primary reflecting electrodes 131 in the display area A and a plurality of first auxiliary reflecting electrodes 132 in the peripheral area B. As such, when the first reflecting electrode layer 130 is prepared by etching, it is not necessary to completely etch a reflecting electrode material of the peripheral area B, which may improve an etching uniformity when the first reflecting electrode layer 130 is prepared, so as to improve an etching accuracy of the first primary reflecting electrode 131. In the display panel provided by the present disclosure, the second reflecting electrode layer 310 includes a second primary reflecting electrode 311 and a second auxiliary reflecting electrode 312 in the display area A and the peripheral area B, respectively. As such, when the second reflecting electrode layer 310 is prepared by etching, it is not necessary to completely etch the reflecting electrode material in the peripheral area, which may improve the etching uniformity when the second reflecting electrode layer 310 is prepared, so as to improve the etching accuracy of the second primary reflecting electrode 311. In the display panel provided by the present disclosure, an orthographic projection of the second primary reflecting electrode 311 on the first reflecting electrode layer 130 is within the corresponding first primary reflecting electrode 131. In this way, light that is not reflected by the second primary reflecting electrode 311 may be reflected by the first primary reflecting electrode 131 to improve the light-emitting rate of the display panel, which improves brightness of the display panel.

Next, a structure, a principle and an effect of the display panel provided by this disclosure will be further explained and illustrated with reference to the figures.

Referring to FIGS. 1 and 2, the display panel provided by the present disclosure may include a display area A and a peripheral area B surrounding the display area A. The display panel may include a driving back plate 100, a first insulating layer 200, and a light-emitting device layer which are sequentially stacked, wherein the driving back plate 100 may include a driving circuit layer 110 and a first reflecting electrode layer 130 which are sequentially stacked.

The driving circuit layer 110 may be formed with a plurality of transistors and storage capacitors, which may be electrically connected to form the driving circuit. In an embodiment of the present disclosure, the transistors may include N-type transistors and P-type transistors. In this way, the driving circuit layer 110 may be prepared with reference to a CMOS process. For example, the driving circuit layer 110 may include a silicon-based semiconductor layer, an insulating layer and a lead layer, wherein the silicon-based semiconductor layer may be formed with a channel region, a source and the drain of a driving transistor; the lead layer may form a gate of the driving transistor; and the insulating layer may isolate the channel region of the driving transistor from the gate. A storage capacitor may be formed in the silicon-based semiconductor layer and the lead layer, or the storage capacitor may be formed between the lead layers in different layers. The lead layer may also form the connection lead connecting the storage capacitor and the thin film transistor, so that the transistor and the storage capacitor are connected to form the driving circuit.

Optionally, among multi-layer lead layers, the lead layer farthest from the silicon-based semiconductor layer may be used as a metal wiring layer 111 of the driving circuit layer. The metal wiring layer 111 may be used as a signal input channel or a signal output channel of the driving circuit layer 110, and is electrically connected with other lead layers of the driving circuit layer. In some embodiments, the metal wiring layer 111 may also be directly electrically connected with the silicon-based semiconductor layer.

In an embodiment of the present disclosure, among the multilayer lead layers of the driving circuit layer 110, a third insulating layer 112 may be disposed between the lead layer 114 closest to the metal wiring layer 111 and the metal wiring layer 111. In other words, among the multilayer lead layers of the driving circuit layer 110, the third insulating layer 112 may be disposed between the lead layer farthest from the silicon-based semiconductor layer (i.e., the metal wiring layer 111) and the lead layer 114 secondly farthest from the silicon-based semiconductor layer. A first via hole may be formed on the third insulating layer 112, and exposes at least part of the lead layer 114 closest to the metal wiring layer 111. A first metal connector 113 may be disposed in the first via hole such that the lead layer 114 closest to the metal wiring layer 111 is electrically connected with the metal wiring layer 111.

The third insulating layer 112 may made of organic or inorganic insulating materials. In an embodiment of the present disclosure, the third insulating layer 112 may be made of silicon oxide, silicon nitride, silicon oxynitride, aluminum nitride, aluminum oxide, silicon glass or other inorganic insulating materials. The material of the first metal connector 113 may be metal materials such as titanium, tungsten, and copper.

In an embodiment of the present disclosure, the third insulating layer 112 and the first metal connector 113 may be formed by the following method: after forming the lead layer 114 of the driving circuit layer relatively away from the silicon-based semiconductor layer (the lead layer 114 closest to the metal wiring layer 111), forming a FSG (fluorinated silicate glass) layer on the surface of the lead layer 114 away from the silicon-based semiconductor layer, and then forming the first via hole on the FSG layer; filling the first via hole with tungsten metal, and then forming the first metal connector 113 composed of the tungsten metal through CMP (chemical mechanical polishing) process.

Optionally, the thickness of the third insulating layer 112 may be 8-12 microns, so that there is a large distance between the metal wiring layer 111 and other lead layers of the driving circuit layer 110 and the silicon-based semiconductor layer of the driving circuit layer 110. This may reduce influence of the electrical signals on the metal wiring layer 111 on various devices of the driving circuit layer 110 and improve the working stability of the driving circuit layer 110.

As shown in FIGS. 1 and 14, between the metal wiring layer 111 and the first reflecting electrode layer 130, the driving back plate 100 may further be provided with a second insulating layer 120 and a second metal connector 121 penetrating through the second insulating layer 120, and the second metal connector 121 connects the metal wiring layer 111 and the first reflecting electrode layer 130.

The second insulating layer 120 is made of organic or inorganic insulating materials. In an embodiment of the present disclosure, the second insulating layer 120 may be made of silicon oxide, silicon nitride, silicon oxynitride, aluminum nitride, aluminum oxide, silicon glass, or other inorganic insulating materials. The second via hole 122 (filled with the second metal connector 121 in FIG. 14) may be formed on the second insulating layer 120, and exposes at least part of the metal wiring layer 111. Optionally, the second insulating layer 120 may also be processed through the CMP process to provide a planarized surface for the first reflecting electrode layer 130 and improve the flatness of the first primary reflecting electrode 131, thereby improving a reflection effect of the first primary reflecting electrode 131.

The second metal connector 121 may be embedded in the second via hole 122 such that the metal wiring layer 111 is connected with the first primary reflecting electrode 131. The materials of the second metal connector 121 may be metal materials such as titanium, tungsten, and copper. In an embodiment of the present disclosure, the second insulating layer 120 and the second metal connector 121 may be formed by the following method: forming a USG (undoped silicate glass) layer on the surface of the metal wiring layer 111 away from the driving circuit layer 110, and then forming a second via hole on the USG layer; filling the second via hole 122 with the metal tungsten, and then forming a second metal connector 121 composed of the metal tungsten through a CMP (chemical mechanical polishing) process, and forming a planarized second insulating layer 120.

Optionally, the diameter of the second via hole 122 may be 0.140-0.324 microns, which may effectively fill a conductive material of the second metal connector 121 and meet impedance requirements of the display panel for the second metal connector 121 thereof.

Optionally, the thickness of the second insulating layer 120 may be 6-10 microns, which may produce a large distance between the first reflecting electrode layer 130 and the metal wiring layer 111, and reduce the interference of the electrical signal on the first primary reflecting electrode 131 on the metal wiring layer 111.

The first reflecting electrode layer 130 is disposed on the surface of the second insulating layer 120 away from the driving circuit layer 110, and may be one or more layers of the conductive materials. The first reflecting electrode layer 130 may have better light reflection ability to improve the display brightness of the display panel. Optionally, the first reflecting electrode layer 130 may include an aluminum metal layer with better conductivity performance and high reflectivity, and protective layers may be provided on both sides of the aluminum metal layer, respectively. Optionally, the first reflecting electrode layer 130 may include a third titanium metal layer, a second aluminum metal layer and a titanium nitride layer sequentially stacked on the surface of the second insulating layer 120. The thickness of the third titanium metal layer may be 80-120 angstroms, the thickness of the second aluminum metal layer may be 700-900 angstroms, and the thickness of the titanium nitride layer may be 80-120 angstroms.

The first reflecting electrode layer 130 may include a plurality of first primary reflecting electrodes 131. Each of the first primary reflecting electrode 131 may be electrically connected with the metal wiring layer 111 through the second metal connector 121 corresponding thereto.

Figure 3:
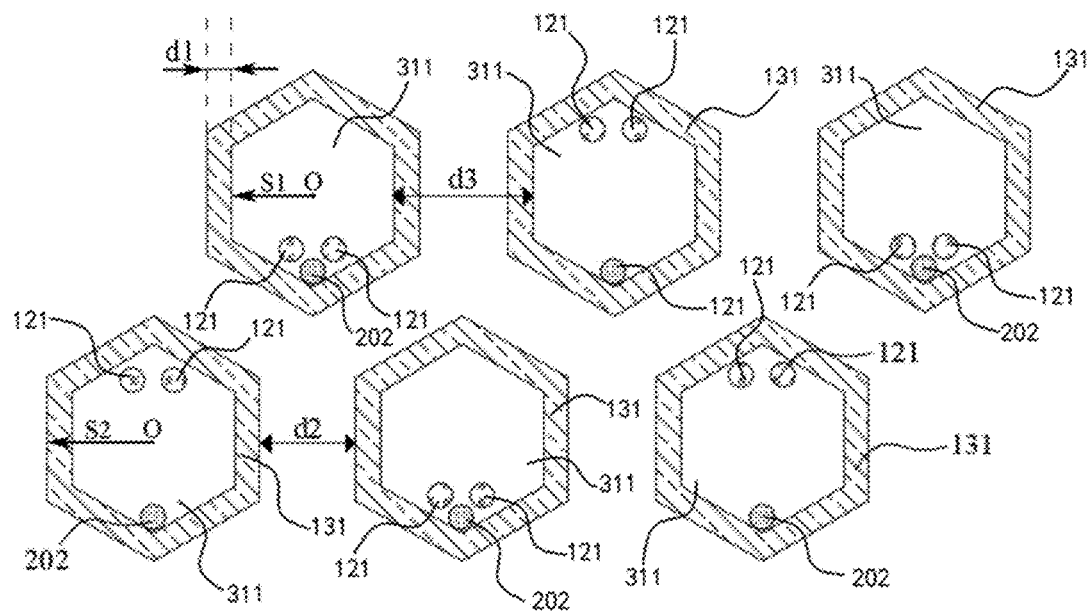
FIG. 3 is a schematic projection view of first reflecting electrodes, second reflecting electrodes, second metal connector and connection via holes according to an embodiment of the present disclosure.

As shown in FIG. 3, in two adjacent ones of the first primary reflecting electrodes 131, the minimum distance between any point on one first primary reflecting electrode 131 and any point on the other first primary reflecting electrode 131 is a distance d2 between the adjacent ones of the first primary reflecting electrodes 131. Optionally, the distance d2 between the adjacent ones of the first primary reflecting electrodes 131 may be reduced as much as possible to increase a covering area of each of the first primary reflecting electrode 131, especially increase an area coverage of the first primary reflecting electrodes 131 in the display area A. In this way, the reflection effect of the first reflecting electrode layer 130 in the display area A may be improved, and the brightness of the display panel may be improved.

In an embodiment of the present disclosure, the distance D2 between the adjacent ones of the first primary reflecting electrodes 131 may be determined according to accuracy of the preparation process. On the premise of meeting process feasibility and controllable cost, a smaller distance d2 between the first primary reflecting electrodes 131 may be adopted within an allowable range of the process. Optionally, the distance d2 between the two adjacent ones of the first primary reflecting electrodes 131 is 0.1-0.3 microns.

In another embodiment of the present disclosure, the distance d2 between adjacent ones of the first primary reflecting electrodes 131 may be determined according to the size of the first primary reflecting electrodes 131, so as to ensure that the first primary reflecting electrodes 131 have a high area coverage and improve the brightness of the display panel. Optionally, the distance between the two adjacent ones of the first primary reflecting electrodes 131 is the second distance d2. The minimum value of the distance between any point on the edges of the first primary reflecting electrodes 131 and a center of the first primary reflecting electrodes 131 is a second dimension value S2. The second distance d2 is within 7%~10% of the second dimension value S2.

Optionally, the first reflecting electrode layer 130 is prepared by semiconductor technology in a wafer factory to ensure the small distance d2 between the adjacent ones of the first primary reflecting electrodes 131, thus avoiding the panel factory from being restricted on the preparation accuracy.

In an embodiment of the present disclosure, the first reflecting electrode layer 130 may be prepared by the following method: forming the first reflecting electrode material layer on the surface of the second insulating layer 120 away from the driving circuit layer 110, and then patterning the first reflecting electrode material layer to form the first reflecting electrode layer 130.

Optionally, any one of the first primary reflecting electrodes 131 is electrically connected with the metal wiring layer 111 through a plurality of second metal connectors 121 such that the stability of the electrical connection between the first primary reflecting electrodes 131 and the metal wiring layer 111 may be ensured. Optionally, as shown in FIG. 3, any one of the first primary reflecting electrodes 131 is electrically connected with the metal wiring layer 111 through two second metal connectors 121.

The shape of the first primary reflecting electrode 131 may be circular, square, triangular, hexagonal, or other shapes. Optionally, as shown in FIG. 3, the first primary reflecting electrode 131 may be a centrally symmetric hexagonal electrode.

In an embodiment of the present disclosure, as shown in FIG. 3, the first primary reflecting electrode 131 is a centrally symmetric hexagonal electrode, and is electrically connected with the metal wiring layer 111 through two second metal connectors 121, and the orthographic projections of the two second metal connectors 121 on the first primary reflecting electrode 131 are close to an apex angle of the first primary reflecting electrode 131. Optionally, the second primary reflecting electrode 311 is a centrally symmetric hexagonal electrode, and the orthographic projections of the two second metal connectors 121 on the second primary reflecting electrode 311 are close to a vertex of the apex angle of the second primary reflecting electrode 311. In this way, a portion of the surface of the second primary reflecting electrode 311, which is uneven caused by the second metal connector 121, is located at the apex angle of the second primary reflecting electrode 311, such that the uniformity of light emission of the light-emitting device may be improved. Where the orthographic projection of the second metal connector 121 on the second primary reflecting electrode 311 is close to the vertex of the apex angle of the second primary reflecting electrode 311 means that the distance between the orthographic projection of the second metal connector 121 on the second primary reflecting electrode 311 and the vertex of the apex angle of the second primary reflecting electrode 311 is not larger than the distance between the other apexes of the second primary reflecting electrode 311.

In an embodiment of the present disclosure, as shown in FIGS. 1 and 14, the peripheral area B may include a bonding area D. The first auxiliary reflecting electrode 132 disposed in the bonding area D is named the fifth auxiliary reflecting electrode 1325. The fifth auxiliary reflecting electrode 1325 is electrically connected to the metal wiring layer 111. The first insulating layer 200 is formed with a bonding hole 201 that exposes at least part of the surface area of the fifth auxiliary reflecting electrode 1325. In this way, the fifth auxiliary reflecting electrode 1325 serves as a bonding pad of the display panel, used as a signal input and output channel. Optionally, the pattern and the size of the fifth auxiliary reflecting electrode 1325 are the same as those of the first primary reflecting electrode 131, so as to improve the etching uniformity when the first reflecting electrode layer 130 is formed by etching.

As shown in FIG. 1, the first insulating layer 200 is disposed on the surface of the first reflecting electrode layer 130 away from the driving circuit layer 110, and may be an organic insulating material or an inorganic insulating material. Optionally, the first insulating layer 200 may be made of silicon oxide, silicon nitride, silicon oxynitride, aluminum nitride, aluminum oxide or other transparent insulating materials. The surface of the first insulating layer 200 away from the driving circuit layer 110 may be a planarized surface, so as to improve flatness of the second primary reflecting electrode 311 and further improve the light emitting effect of the light-emitting device. In an embodiment of the present disclosure, the material of the first insulating layer 200 may be silicon oxide.

The first insulating layer 200 may have high light transmittance. In this way, among the light emitted by the light-emitting devices, a part of the light that are not able to be emitted from the display panel may be irradiated to the first primary reflecting electrode 131, and then emitted from the display panel after being reflected by the first primary reflecting electrode 131, thereby improving the display brightness of the display panel. Optionally, the light transmittance of the first insulating layer 200 is not less than 70%.

Optionally, the light transmittance of the first insulating layer 200 is not less than 80%. The thickness of the first insulating layer 200 may be less than 1 micron, for example, less than 2000 angstroms, to ensure the light transmittance of the first insulating layer 200. In an embodiment of the present disclosure, the thickness of the first insulating layer 200 may be 300-2000 angstroms. Further, the thickness of the first insulating layer 200 may be 300-400 angstroms.

Optionally, as shown in FIGS. 1 and 3, the first insulating layer 200 may also be provided with a plurality of connection via holes 202. In the display area A, the connection via holes 202 are arranged to correspond to the first primary reflecting electrode 131 and the second primary reflecting electrode 311 one by one, wherein the connection via holes 202 respectively expose partial areas of the first primary reflecting electrodes 131. In this way, the first primary reflecting electrodes 131 and the second primary reflecting electrodes 311 may be electrically connected in one-to-one correspondence through the connection via holes 202.

Optionally, the diameter of the connection via hole 202 is 0.2-0.4 microns, so as to avoid that the material of the second primary reflecting electrode 311 cannot be effectively filled because the diameter of the connection via hole 202 is too small, and to avoid that the uneven area of the second primary reflecting electrode 311 is too large because the diameter of the connection via hole 202 is too large. In an embodiment of the present disclosure, the diameter of the connection via hole 202 is 0.20-0.25 microns.

As shown in FIGS. 1 and 3, the second transmitting electrode layer 310 may include a plurality of second primary reflecting electrodes 311. The second primary reflecting electrodes 311 may be electrically connected with the first primary reflecting electrodes 131 in one-to-one correspondence. In the display area A, the second primary reflecting electrodes 311 may serve as pixel electrodes of a light-emitting device. Optionally, the sizes and the patterns of the second primary reflecting electrodes 311 are completely the same, so that the etching uniformity during etching to form the second primary reflecting electrodes 311 may be ensured, and the etching accuracy of the second primary reflecting electrodes 311 may be improved.

The second reflecting electrode layer 310 may be made of a metal material, so that the second reflecting electrode layer 310 has a reflecting ability. Optionally, the second reflecting electrode layer 310 includes a first titanium metal layer, a first aluminum metal layer, a second titanium metal layer and a molybdenum metal layer which are sequentially stacked on the surface of the first insulating layer 200 away from the driving circuit layer 110. Among them, the first titanium metal layer has a thickness of 80-120 angstroms, the first aluminum metal layer has a thickness of 400-500 angstroms, the second titanium metal layer has a thickness of 40-60 angstroms, and the molybdenum metal layer has a thickness of 40-60 angstroms.

Optionally, as shown in FIG. 3, the distance d3 between adjacent ones of the second primary reflecting electrodes 311 may be reduced as much as possible to increase coverage areas of the second primary reflecting electrodes 311 and the areas of the second primary reflecting electrodes 311, especially increase the area coverage of the second primary reflecting electrodes 311 in the display area A, thereby increasing a luminous area of the light-emitting device, and then improving a luminous brightness of the display panel, and preparing a high-brightness display panel. Among the two adjacent ones of the second primary reflecting electrodes 311, the minimum distance between any point on one second primary reflecting electrode 311 and any point on the other second primary reflecting electrode 311 is the distance d3.

In an embodiment of the present disclosure, the distance D3 between the adjacent ones of the second primary reflecting electrodes 311 may be determined according to the accuracy of the preparation process. On the premise of meeting the process feasibility, etc., the smaller distance d3 between the second primary reflecting electrodes 311 may be adopted within the process allowable range. Optionally, the distance d3 between the two adjacent ones of the second primary reflecting electrodes is 0.1-1.0 microns. Optionally, the distance d3 between the two adjacent ones of the second primary reflecting electrodes is 0.6-1.0 microns.

In another embodiment of the present disclosure, the distance d3 between adjacent ones of the second primary reflecting electrodes 311 may be determined according to the sizes of the second primary reflecting electrodes 311, such that the second primary reflecting electrodes 311 having high area coverage may be ensured and an opening ratio and brightness of the display panel may be improved. Optionally, the minimum value of the distance between any point of the edge of the second primary reflecting electrode 311 and the center o of the second primary reflecting electrode 311 is the first dimension value S1. The distance d3 between the two adjacent ones of the second primary reflecting electrodes 311 is the third distance d3. The third distance d3 is within a range of 30%~50% of the first dimension value S1.

Optionally, as shown in FIG. 3, an orthographic projection of the center of the second primary reflecting electrode 311 on the first reflecting electrode layer 130 overlaps the center of the corresponding first primary reflecting electrode 131. In this way, the best reflection effect of the first primary reflecting electrode 131 may be ensured.

Optionally, as shown in FIG. 3, an orthographic projection of the second primary reflecting electrode 311 on the first reflecting electrode layer 130 is within the corresponding first primary reflecting electrode 131. There may be a distance between the edge of an orthographic projection of the second primary reflecting electrode 311 on the first reflecting electrode layer 130 and the edge of the corresponding first primary reflecting electrode 131, so that the display panel has a suitable distance so as to achieve a balance on aspects of a preparation accuracy and reflection effect of the first main reflective electrode 131, a preparation accuracy and reflection effect of the second main reflective electrode 311, a total reflection effect of the display area A, and so on. The minimum value of the distance between any point of the second primary reflecting electrode 311 on an edge of the orthographic projection of the first reflecting electrode layer 130 and any point of the corresponding first primary reflecting electrode 131 is the first distance d1.

In an embodiment of the present disclosure, the first distance d1 may be zero. In this way, an orthographic projection of the second primary reflecting electrode 311 on the first reflecting electrode layer 130 overlaps the corresponding second primary reflecting electrode 311.

In another embodiment of the present disclosure, a first distance d1 may be determined according to parameters such as an accuracy of a preparation process to avoid the first distance d1 being too large. Optionally, the distance between an edge of the second primary reflecting electrode 311 on the orthographic projection of the first reflecting electrode layer 130 and an edge of the corresponding first primary reflecting electrode 131 is 0.2-0.5 microns.

In another embodiment of the present disclosure, the first distance d1 may be determined according to the size of the second primary reflecting electrode 311. Optionally, the distance between the edge of an orthographic projection of the second primary reflecting electrode 311 on the first reflecting electrode layer 130 and the edge of the corresponding first primary reflecting electrode 311 is the first distance d1. The minimum value of the distance between any point of the edge of the second primary reflecting electrode 311 and the center o of the second primary reflecting electrode 311 is a first dimension value S1. The first distance d1 is within a range of 13%-17% of the first dimension value S1.

Figure 4:
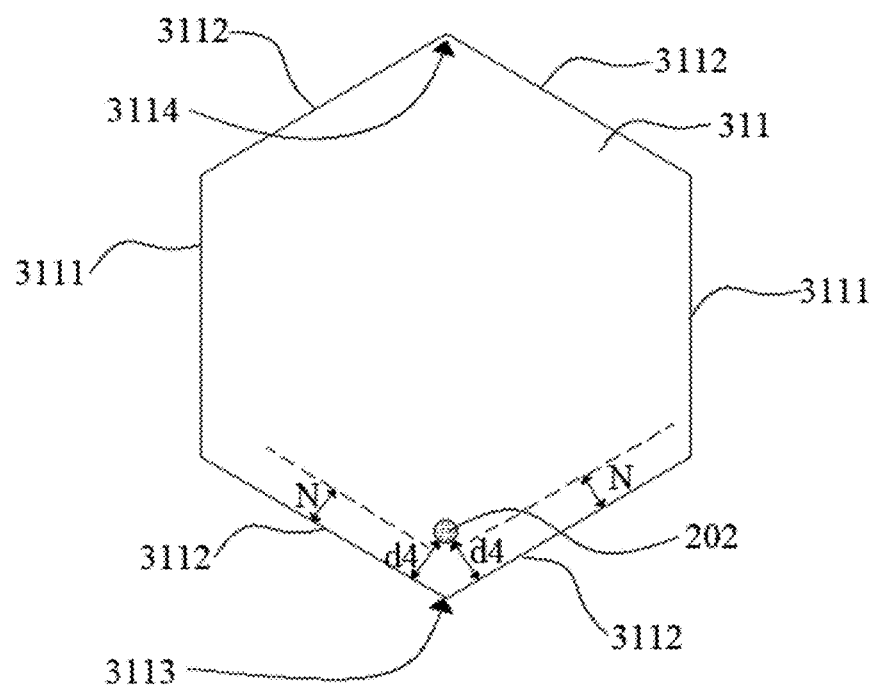
FIG. 4 is a schematic projection view of second reflecting electrodes and connection via holes according to an embodiment of the present disclosure.
Figure 5:
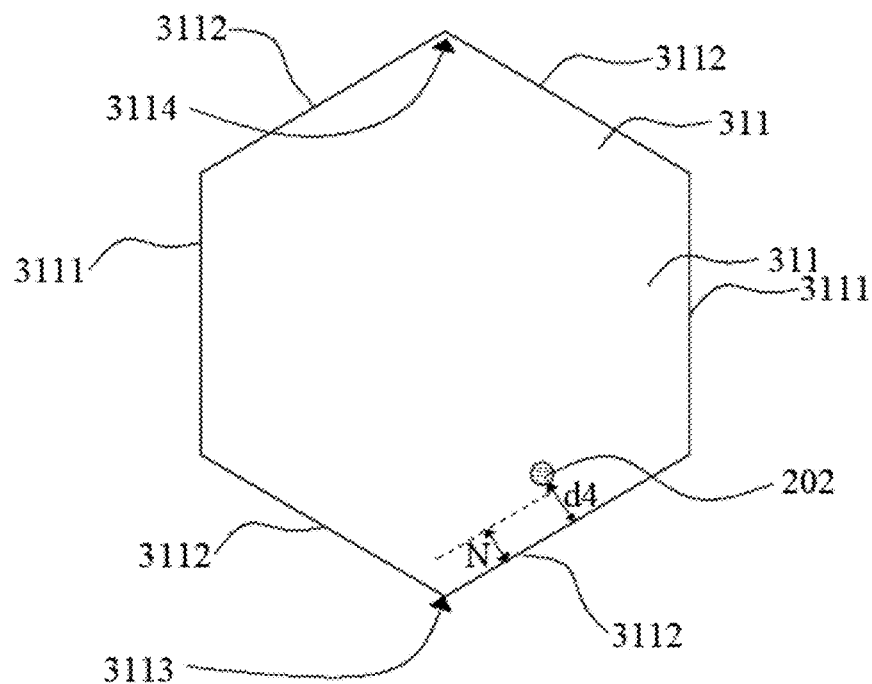
FIG. 5 is a schematic projection view of second reflecting electrodes and connection via holes according to an embodiment of the present disclosure.

Optionally, as shown in FIG. 3, the pattern of the second primary reflecting electrode 311 is hexagonal. Optionally, as shown in FIG. 4 and FIG. 5, the second primary reflecting electrode 311 is a centrally symmetric hexagon and includes two first side walls 3111 that are oppositely arranged, and four second side walls 3112 that are connected with the two first side walls 3111 and have the same length. The four second side walls 3112 form the first apex angle 3113 and the second apex angle 3114 which are oppositely arranged. Alternatively, in the second primary reflecting electrode 311, the distance between the two first side walls 3111 is 3.8-4.3 microns, and the distance between the first vertex and the second vertex is 4.8-5.4 microns.

Optionally, the first primary reflecting electrode 131 is also a centrally symmetric hexagon, and the six side walls of the first primary reflecting electrode 131 are parallel to the six side walls of the second primary reflecting electrode 311 in one-to-one correspondence. An orthographic projection of the second primary reflecting electrode 311 on the first reflecting electrode layer 130 is within the corresponding first primary reflecting electrode 131, and the center of the second primary reflecting electrode 311 in an orthographic projection of the first reflecting electrode layer 130 overlaps the center of the corresponding first primary reflecting electrode 131.

In an embodiment of the present disclosure, the second reflecting electrode layer 310 may be prepared in a panel factory. Optionally, the second reflecting electrode layer 310 may be prepared by the following method: forming the second reflecting electrode material layer on the surface of the first insulating layer 200 away from the substrate, and covering connection via holes 202 to electrically connect with first primary reflecting electrodes 131; patterning the second reflecting electrode material layer to form the second reflecting electrode layer 310. In the display area A, the orthographic projections of the connection via holes 202 on the second reflecting electrode layer 310 is within the corresponding second primary reflecting electrodes 311. In this way, the second primary reflecting electrode 311 is electrically connected with the first primary reflecting electrode 131 through the corresponding connection via hole 202, and there is no need to specially manufacture the metal member connecting the first primary reflecting electrode 131 and the second primary reflecting electrode 311, which may simplify the preparation process of the display panel and reduce preparation cost.

Figure 6:
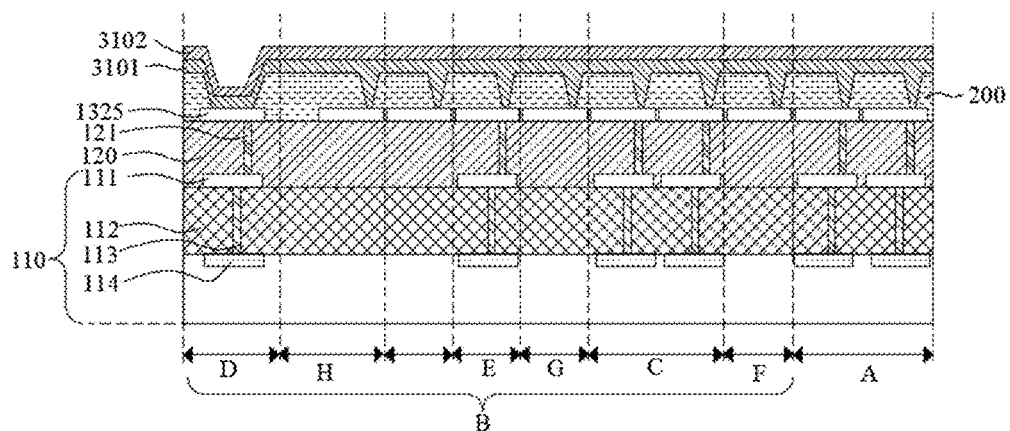
FIG. 6 is a schematic structural view of forming a first photoresist layer and an anti-reflective layer according to an embodiment of the present disclosure.

Further, in order to improve preparation accuracy of the second reflecting electrode layer 310 and further reduce the distance between the second primary reflecting electrodes 311, the second reflecting electrode layer 310 may be prepared by the following method:

As shown in FIG. 6, an anti-reflective layer 3101 and a first photoresist layer 3102 are sequentially formed on the side of the first insulating layer 200 away from the driving circuit layer 110.

Figure 7:
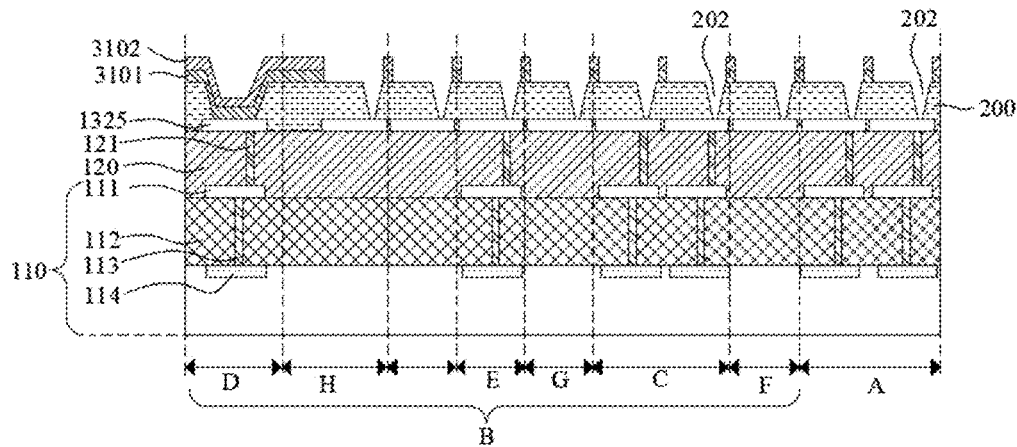
FIG. 7 is a schematic structural view of patterning a first photoresist layer and an anti-reflective layer according to an embodiment of the present disclosure.

Then, as shown in FIG. 7, the anti-reflective layer 3101 and the first photoresist layer 3102 are exposed and developed to remove the anti-reflective layer 3101 and the first photoresist layer 3102 where the second reflecting electrode layer 310 is to be formed, for example, the anti-reflective layer 3101 and the first photoresist layer 3102 at corresponding positions of the second primary reflecting electrode 311 and the second auxiliary reflecting electrode 312 are removed. In other words, orthographic projections of the remained anti-reflective layer 3101 and first photoresist layer 3102 on the first reflecting electrode layer 130 may complement an orthographic projection of the second reflecting electrode layer 310 on the first reflecting electrode layer 130.

Figure 8:
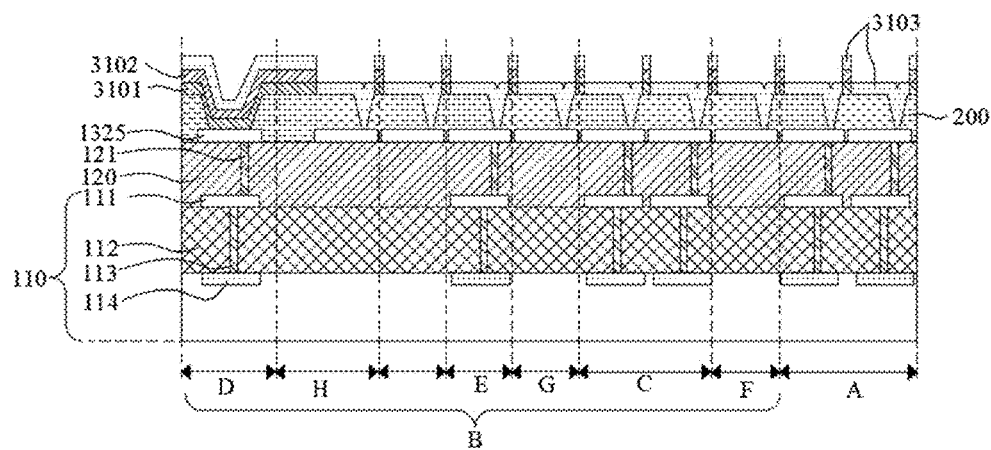
FIG. 8 is a schematic structural view of forming a second reflecting electrode material layer according to an embodiment of the present disclosure.

Then, as shown in FIG. 8, a conductive material is deposited on the side of the anti-reflective layer 3101 and the first photoresist layer 3102 away from the driving circuit layer 110 to form the second reflecting electrode material layer 3103. A part of the conductive material is deposited on the surface of the remained first photoresist layer 3102 away from the driving circuit layer 110, and a part of the conductive material is deposited in a gap between the remained anti-reflective layer 3101 and the first photoresist layer 3102.

Figure 9:
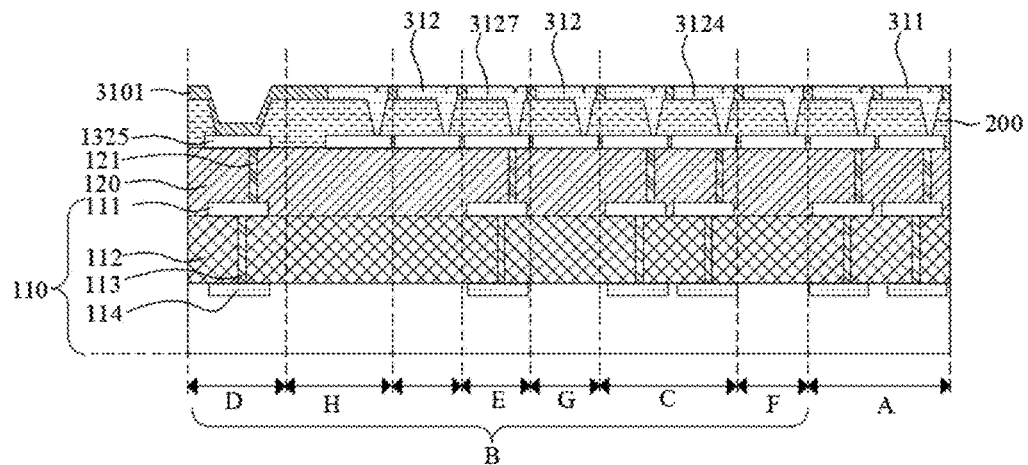
FIG. 9 is a schematic structural view of stripping a first photoresist layer according to an embodiment of the present disclosure.

Then, as shown in FIG. 9, the first photoresist layer 3102 is stripped, so that the conductive material deposited on the remained first photoresist layer 3102 is stripped, and the second reflecting electrode material layer 3103 is patterned, such that the second reflecting electrode layer second reflecting electrode layer second reflecting electrode layer second reflecting electrode layer second reflecting electrode layer 310 is obtained.

Figure 10:
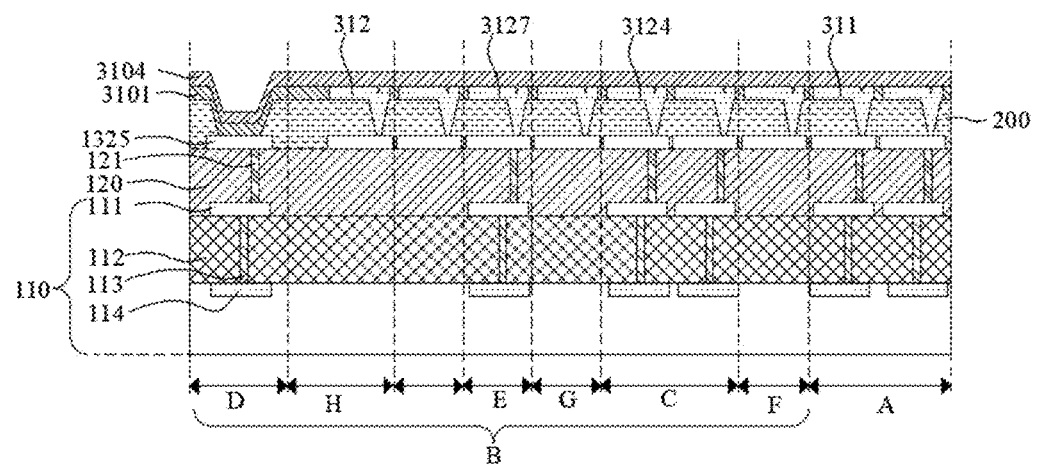
FIG. 10 is a schematic structural view of forming a second photoresist layer according to an embodiment of the present disclosure.

Then, as shown in FIG. 10, the second photoresist layer 3104 is formed on the side of the remained anti-reflective layer 3101 and the second reflecting electrode layer 310 away from the driving circuit layer 110.

Figure 11:
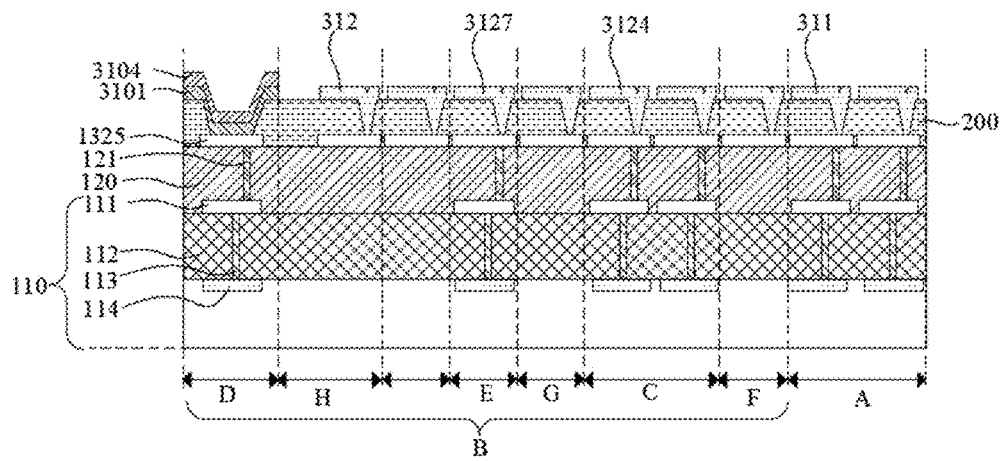
FIG. 11 is a schematic structural view of patterning a second photoresist layer according to an embodiment of the present disclosure.

Then, as shown in FIG. 11, the second photoresist layer 3104 and the remained anti-reflective layer 3101 are exposed and developed to remove the second photoresist layer 3104 and the remained anti-reflective layer 3101 except for the bonding area D. In this way, after exposure and development, the fifth auxiliary reflecting electrode 1325 in the bonding area D is covered and protected by the anti-reflective layer 3101 and the second photoresist layer 3104, and then the anti-reflective layer 3101 and the second photoresist layer 3104 in the display area A are removed.

In this way, when the second reflecting electrode layer 310 is prepared, the anti-reflective layer 3101 is formed, and then the first photoresist layer 3102 is formed. The anti-reflective layer 3101 may reduce a reflection of light during exposure, thereby improving exposure accuracy and improving a preparation accuracy of the second reflecting electrode layer 310. The preparation accuracy of the second reflecting electrode layer 310 is improved, in order to reduce the distance between the second primary reflecting electrodes 311.

Figure 12:
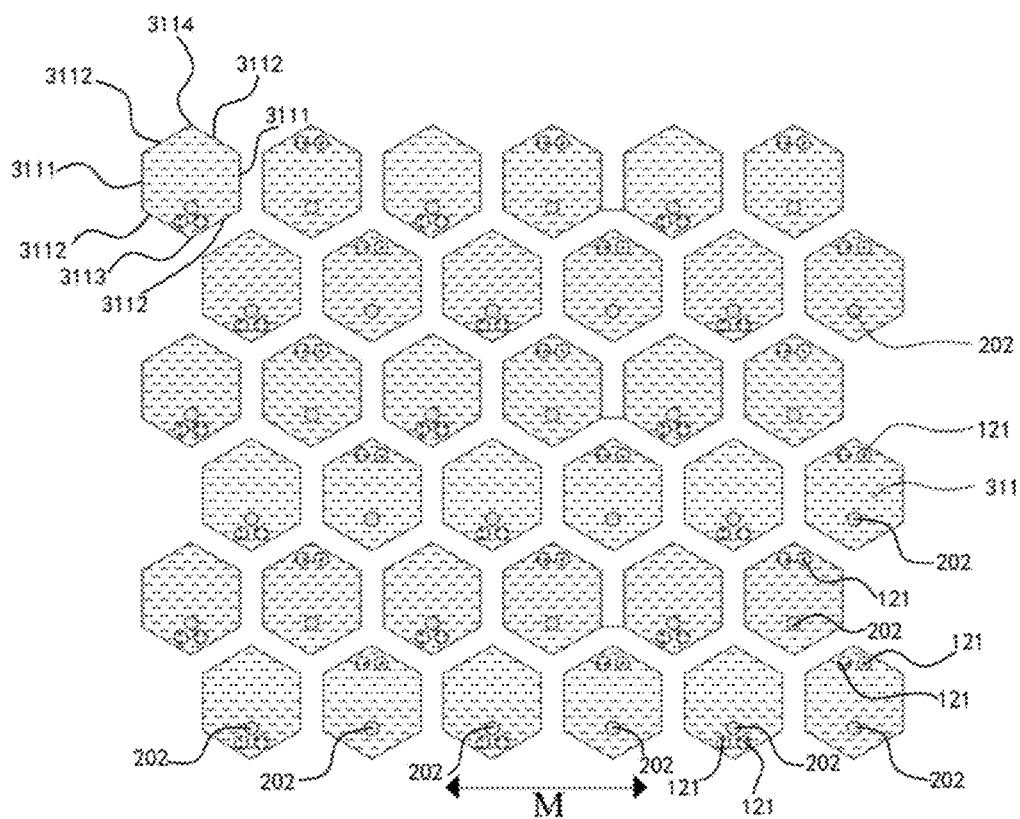
FIG. 12 is a schematic view of an arrangement of second reflecting electrodes according to an embodiment of the present disclosure.
Figure 13:
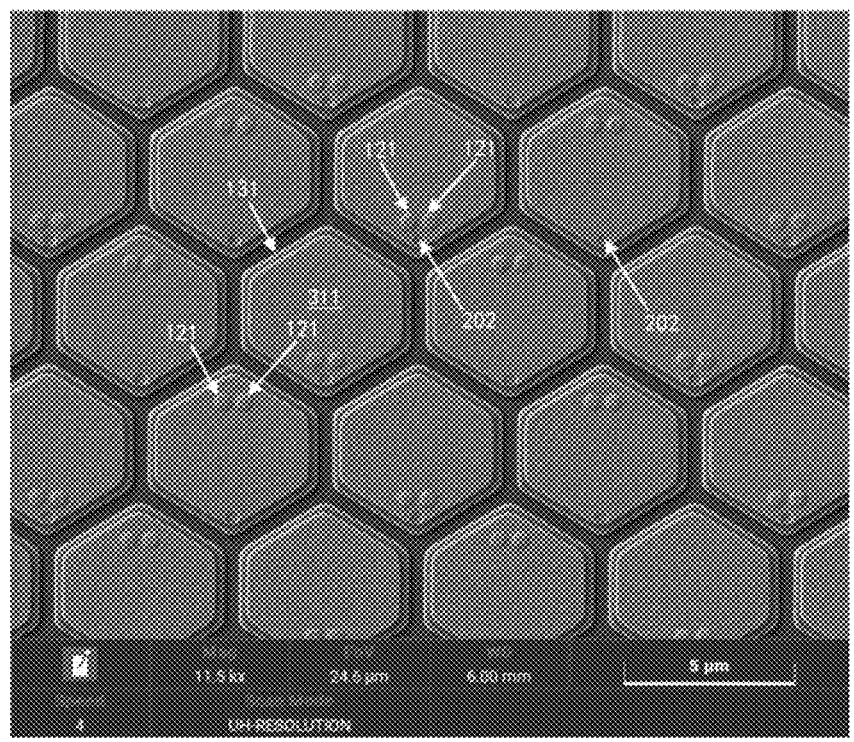
FIG. 13 is an electron micrograph of a second reflecting electrode according to an embodiment of the present disclosure.

In an embodiment of the present disclosure, as shown in FIG. 12 and FIG. 13, the orthographic projection of the connection via hole 202 on the second reflecting electrode layer 310 is located at the edge of the corresponding second primary reflecting electrode 311. Optionally, the orthographic projection of the connection via hole 202 on the second reflecting electrode layer 310 is located at the apex angle of the corresponding second primary reflecting electrode 311. For example, the second primary reflecting electrode 311 is hexagonal, and an orthographic projection of the connection via hole 202 on the second reflecting electrode layer 310 is within the hexagon and at one of the apex angles. An uneven surface of the second primary reflecting electrode 311 are caused by the connection via hole 202 such that a luminous angle and luminous uniformity at this position may be changed. The uneven surface is located at an edge of the second primary reflecting electrode 311, which may minimize an influence of a luminous change at this position and ensure an overall light-emitting effect of the light-emitting device.

In another embodiment of the present disclosure, as shown in FIGS. 4 and 5, an orthographic projection of the connection via hole 202 on the second reflecting electrode layer 310 is within the corresponding second primary reflecting electrode 311, and the distance d4 from the edge of the second primary reflecting electrode 311 is not less than the first threshold value N. The distance d4 between the orthographic projection of the connection via hole 202 on the second reflecting electrode layer 310 and the edge of the corresponding second primary reflecting electrode 311 refers to the minimum value between any point on the orthographic projection of the connection via hole 202 on the second emitting electrode layer 310 and any point on the edge of the corresponding second primary reflecting electrode 311. In this way, when the second reflecting electrode material layer 3103 is patterned, even if an alignment deviation occurs, it is more difficult to etch the second reflecting electrode material layer 3103 within the connection via hole 202, which reduces a risk of resistance increase or disconnection between the second primary reflecting electrode 311 and the first primary reflecting electrode 131, improves a yield of the display panel, and enlarges a process window when preparing the second emissive electrode layer 310. Optionally, the first threshold is between 0.13 times and 1.3 times of the distance d3 between the two adjacent ones of the second primary reflecting electrodes.

In this way, in the display area A, an orthographic projection of the connection via hole 202 on the second reflecting electrode layer 310 is within the corresponding second primary reflecting electrode 311. The minimum value of the distance between any point of the orthographic projection of the connection via hole 202 on the second reflecting electrode layer 310 and any point of an edge of the corresponding second primary reflecting electrode 311 is not less than the first threshold value N. That is, the distance between an orthographic projection of the connection via hole 202 on the second reflecting electrode layer 310 and an edge of the corresponding second primary reflecting electrode 311 is not less than the first threshold value N. In other words, any second primary reflecting electrode 311 may include a closed confined area, and the minimum value of the distance between any point of the edge of the confined area and any point of an edge of the second primary reflecting electrode 311 is equal to the first threshold value N. An orthographic projection of the connection via hole 202 on the second primary reflecting electrode 311 is completely within the confined area of the second primary reflecting electrode 311.

In an embodiment of the present disclosure, the first threshold value N may also be determined according to alignment accuracy when the second reflecting electrode material layer 3103 is patterned. Optionally, the first threshold N is equal to the alignment accuracy. In this way, it is ensured that an orthographic projection of the connection via hole 202 on the second reflecting electrode layer 310 is within the corresponding second primary reflecting electrode 311, which avoids resistance increase or bad break short circuit between the second primary reflecting electrode 311 and the first primary reflecting electrode 131 caused by etching of the conductive material in the connection via hole 202, and may improve a yield of the display panel and expand a process window when the second reflecting electrode layer 310 is prepared. Optionally, the first threshold value N is 100-300 nm. For example, the first threshold value N is 100-200 nanometers.

In another embodiment of the present disclosure, the first threshold value N may also be determined according to the size of the second primary reflecting electrode 311. Optionally, the minimum value of the distance between any point on an edge of the second primary reflecting electrode 311 and the center of the second primary reflecting electrode 311 is the first dimension value [s1]. The first threshold value N is within a range of 5%~8% of the first dimension value [s1]. In this way, an orthographic projection of the connection via hole 202 on the second primary reflecting electrode 311 is close to an edge of the second primary reflecting electrode 311 as much as possible, thus achieving the balance between assurance of the light-emitting effect of the light-emitting device and improvement of the yield of the display panel.

Optionally, the distance between the center of the orthographic projection of the connection via hole 202 on the second reflecting electrode layer 310 and a specific edge of the corresponding second primary reflecting electrode 311 is not larger than the distance of other edges. The distance between the center of an orthographic projection of the connection via hole 202 on the second reflecting electrode layer 310 and the specific edge is the sixth distance. The distance between the specific edge and the center of the second primary reflecting electrode 311 is the seventh distance. The sixth distance is 8%~14% of the seventh distance. Among the edges of the second primary reflecting electrode 311, the specific edge is the edge closest to the orthographic projection of the connection via hole 202 on the second primary reflecting electrode 311. In this way, on the premise of reducing the poor connection of the connection via hole 202 caused by etching alignment offset, the connection via hole 202 is close to the edge of the second primary reflecting electrode 311 as much as possible, thus the balance between assurance of a light-emitting effect of the light-emitting device and improvement of a yield of the display panel may be achieved.

Optionally, the orthographic projection of the connection via hole 202 on the second reflecting electrode layer 310 is within the corresponding second primary reflecting electrode 311, and the distance d4 is equal to the first threshold value N. Further, the second primary reflecting electrode 311 has at least a first edge and a second edge adjacent to each other. The minimum value of the distance between any point of the orthographic projection of the connection via hole 202 on the second reflecting electrode layer 310 and any point of the first edge of the corresponding second primary reflecting electrode 311 is equal to the first threshold value N. Also, the minimum value of the distance between any point of the orthographic projection of the connection via hole 202 on the second reflecting electrode layer 310 and any point of the second edge of the corresponding second primary reflecting electrode 311 is equal to the first threshold value N. That is, the second primary reflecting electrode 311 has at least the first edge and the second edge adjacent to each other, and the distance between the first edge and the orthographic projection of the connection via hole 202 on the second reflecting electrode layer 310 is equal to the first threshold N. That is, referring to FIG. 4, the distance d4 in FIG. 4 may be equal to the first threshold value N. In this way, the orthographic projection of the connection via hole 202 on the second primary reflecting electrode 311 is close to the edge of the second primary reflecting electrode 311 as much as possible, and an uneven surface of the second primary reflecting electrode 311 is close to the edge of the second primary reflecting electrode 311 as much as possible, thereby reducing an influence on a luminous uniformity of the light-emitting device caused by the connection via hole 202.

Optionally, the orthographic projection of the second metal connector 121 electrically connected to the second primary reflecting electrode 311 on the second reflecting electrode layer 310 is within the second primary reflecting electrode 311 and does not completely overlap the orthographic projection of the connection via hole 202 on the second reflecting electrode layer 310. In this way, it is possible to avoid poor contact between the first primary reflecting electrode 131 and the second primary reflecting electrode 311 caused by alignment deviation when the first primary reflecting electrode 131 is prepared, and ensure that the first primary reflecting electrode 131 may completely cover the second metal connector 121, and further ensure that the second metal connector 121 may be electrically connected with the second primary reflecting electrode 311 through the first primary reflecting electrode 131. Besides, it is also possible to avoid influences on the connection via hole 202 due to a possible occurrence of the uneven surface of the second metal connector 121, improve a connection strength of a joint surface between the second primary reflecting electrode 311 and the first primary reflecting electrode 131 in the connection via hole 202, and reduce a contact resistance.

Figure 16:
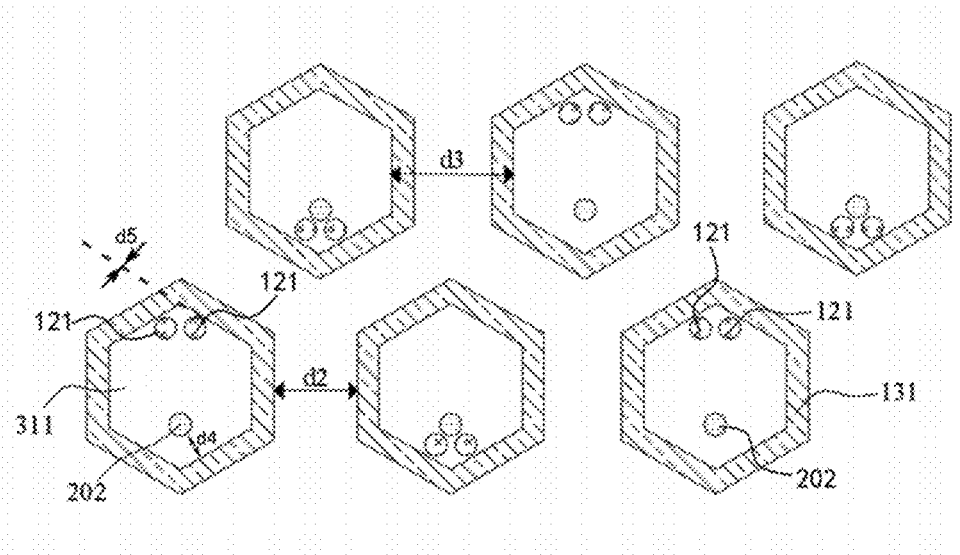
FIG. 16 is a schematic projection view of a first reflecting electrode, a second reflecting electrode, a second metal connector and connection via holes according to another embodiment of the present disclosure.

Optionally, the minimum value of the distance between any point of the orthographic projection of the connection via hole 202 on the second reflecting electrode layer 310 and any point of the edge of the corresponding second primary reflecting electrode 311 is equal to the fourth distance d4. The minimum value of the distance between any point of the orthographic projection of the second metal connector 121 on the second reflecting electrode layer 310 and any point of the edge of the second primary reflecting electrode 311 electrically connected by the second metal connector 121 is equal to the fifth distance d5. As shown in FIG. 16, the fifth distance d5 is smaller than the fourth distance d4. In this way, the orthographic projection of the second metal connector 121 on the second reflecting electrode layer 310 may also be close to the edge of the second primary reflecting electrode 311, which prevents the second metal connector 121 from generating an uneven surface in the middle of the second primary reflecting electrode 311, thereby ensuring the light-emitting effect of the light-emitting device.

Optionally, the orthographic projection of the second metal connector 121 on the second reflecting electrode layer 310 is within the second primary reflecting electrode 311 electrically connected with the second metal connector 121. The minimum value of the distance between any point of the orthographic projection of the second metal connector 121 on the second reflecting electrode layer 310 and any point of an edge of the second primary reflecting electrode 311 electrically connected with the second metal connector 121 is not greater than the second threshold value. And the second threshold is smaller than the first threshold N. It may be understood that the second threshold is not less than 0. In this way, the orthographic projection of the second metal connector 121 on the second reflecting electrode layer 310 may also be close to the edge of the second primary reflecting electrode 311, which prevents the second metal connector 121 from generating an uneven surface in the middle of the second primary reflecting electrode 311, thereby ensuring a light-emitting effect of the light-emitting device.

Optionally, as shown in FIG. 12, the orthographic projection of the second primary reflecting electrodes 311 on the driving circuit layer 110 is a centrally symmetric hexagon, and the three adjacent ones of the second primary reflecting electrodes 311 have the same distance from each other, so that the second primary reflecting electrodes 311 are arranged in a honeycomb shape. Each of the second primary reflecting electrodes 311 is formed with a plurality of second primary reflecting electrode rows arranged along the row direction M. In this way, an arrangement density of the second primary reflecting electrodes may be improved, and a display effect of the display panel may be improved by using a pixel borrowing algorithm.

Optionally, in the same second primary reflecting electrode row, the orthographic projections of the connection via holes 202 on the corresponding second primary reflecting electrodes 311 are on the same straight line, so that the connection via holes 202 corresponding to the second primary reflecting electrodes 311 are on the same straight line. The orthographic projection position of the second metal connector 121 electrically connected to the second primary reflecting electrode 311 on the second primary reflecting electrode 311 has a symmetrical relationship, for example an axisymmetric relationship or a central symmetrical relationship among two second primary reflecting electrodes 311 arranged adjacent to the second primary reflecting electrode row. For example, the second metal connectors 121 electrically connected to two second primary reflecting electrodes 311 spaced apart from each other are on the same straight line along the row direction M. The second metal connectors 121 electrically connected to the two adjacent ones of the second primary reflecting electrodes 311 are not on the same straight line along the row direction M.

In an embodiment of the present disclosure, as shown in FIG. 12, the second primary reflecting electrodes 311 are centrally symmetric hexagons, and each of the second primary reflecting electrodes 311 is arranged in a honeycomb shape. Each of the second primary reflecting electrodes 311 is formed with a plurality of second primary reflecting electrode rows arranged along the row direction M. Each of the second primary reflecting electrodes 311 includes two first side walls 3111 opposite to each other and four second side walls 3112 connected with the two first side walls 3111, both of the first side walls 3111 are perpendicular to the row direction M, and the four second side walls 3112 have the same length. The four second side walls 3112 enclose the first apex angle 3113 and the second apex angle 3114 which are arranged opposite to one another. The minimum value of the distance between any point of the orthographic projection of the connection via hole 202 on the corresponding second primary reflecting electrode 311 and any point on any one of the two second side walls 3112 of the first apex angle 3113 of the second primary reflecting electrode 311 is equal to the first threshold value N. In other words, the distance between the orthographic projection of the connection via hole 202 on the corresponding second primary reflecting electrode 311 and the two second side walls 3112 of the first corner 3113 is the first threshold value N.

Optionally, positions of the orthogonal projection of the connection via holes 202 on the corresponding second primary reflecting electrodes 311 are arranged in the same way in two adjacent ones of the second primary reflecting electrodes of the second primary reflecting electrode row.

Optionally, positions of the orthogonal projections of the second metal connector 121 electrically connected to the second primary reflecting electrode 311 on the second primary reflecting electrode 311 has a symmetrical relationship among the two adjacent ones of the second primary reflecting electrodes in the second primary reflecting electrode row. Optionally, the orthographic projection position of the second metal connector 121 electrically connected to the second primary reflecting electrode 311 on the second primary reflecting electrode 311 has a centrally symmetric relationship among the two adjacent ones of the second primary reflecting electrodes in the second primary reflecting electrode row.

Optionally, the orthographic projection of the second metal connector 121 on the second reflecting electrode layer 310 is within the second primary reflecting electrode 311 electrically connected with the second metal connector 121, and the distance from a vertex of the first apex angle 3113 or a vertex of the second apex angle 3114 is larger than the distance from vertices of other apex angles of the second primary reflecting electrode 311. That is, the orthographic projection of the second metal connector 121 on the second reflecting electrode layer 310 is close to the first apex angle 3113 or the second apex angle 3114 of the second primary reflecting electrode 311 electrically connected with the second metal connector 121.

For example, in the two adjacent ones of the second primary reflecting electrodes 311 in the same second primary reflecting electrode row, the distance between the orthographic projection of the second metal connector 121 electrically connected to one second primary reflecting electrode 311 and the vertex of the first apex angle 3113 of the second primary reflecting electrode 311 is larger than the distance between the orthographic projection of the second metal connector 121 electrically connected to one second primary reflecting electrode 311 and the vertex of other apex angles of the second primary reflecting electrode 311. The distance between the orthographic projection of the second metal connector 121 electrically connected to another second primary reflecting electrode 311 on the second primary reflecting electrode 311 and the vertex of the second apex angle 3114 of the second primary reflecting electrode 311 is larger than the distance between the orthographic projection of the second metal connector 121 electrically connected to another second primary reflecting electrode 311 on the second primary reflecting electrode 311 and the vertex of the other apex angles of the second primary reflecting electrode 311. That is, in the same second primary reflecting electrode row, the second metal connectors 121 spaced from each other and electrically connected to two second primary reflecting electrodes 311 of one second primary reflecting electrode 311 are all arranged close to the first apex angle 3113 or the second apex angle 3114, and the second metal connectors 121 electrically connected to the two adjacent ones of the second primary reflecting electrodes 311 are close to the first apex angle 3113 and the second apex angle 3114, respectively. In this way, the process stability and the process feasibility may be improved when the first reflecting electrode layer 130, the first insulating layer and the second reflecting electrode layer 310 are prepared.

In an embodiment of the present disclosure, as shown in FIGS. 1, 14 and 15, the peripheral area B includes a sensing area C. A sensing devices is formed in the sensing area C, and is used for simulating and detecting working conditions of the light-emitting devices in the display area A, and adjusting the drive of the light-emitting devices according to the simulation results, so that the light-emitting devices emit light more accurately. The first auxiliary reflecting electrode 132 includes a plurality of third auxiliary reflecting electrodes 1323 electrically connected with the metal wiring layer 111 in the sensing area C. The pattern of the third auxiliary reflecting electrodes 1323 are the same as that of the first primary reflecting electrode 131. The second auxiliary reflecting electrode 312 includes a plurality of fourth auxiliary reflecting electrodes 3124 in the sensing area C. The fourth auxiliary reflecting electrodes 3124 are electrically connected with the third auxiliary reflecting electrode 1323 in one-to-one correspondence. The patterns of the fourth auxiliary reflecting electrode 3124 are the same as that of the second primary reflecting electrode 311. An organic light-emitting layer 320 and a common electrode layer 330 cover the sensing area C. In this way, the second primary reflecting electrode 311, the organic light-emitting layer 320 and the common electrode layer 330 form a light-emitting device in the display area A. The fourth auxiliary reflecting electrode 3124, the organic light-emitting layer 320 and the common electrode layer 330 form a sensing device in the sensing area C, and the light-emitting device and the sensing device are electrically connected with the metal wiring layer 111 through the first primary reflecting electrode 131 and the third auxiliary reflecting electrode 1323, respectively. Therefore, it may be ensured that the light-emitting device and the sensing device are in the same electrical environment, so that the simulation test result of the sensing device is more matched with the actual situation of the light-emitting device, the accuracy of the simulation test result of the sensing device is improved, and the adjustment accuracy of the light-emitting device is further improved.

In an embodiment of the present disclosure, as shown in FIG. 1, FIG. 14 and FIG. 15, the peripheral area B may also include a cathode overlapping area E; the first reflecting electrode layer 130 may further include the sixth auxiliary reflecting electrode 1326 disposed in the cathode overlapping area E; the sixth auxiliary reflecting electrode 1326 is electrically connected with the metal wiring layer 111; the sixth auxiliary reflecting electrode 1326 may be directly or indirectly electrically connected with the common electrode layer 330 so as to provide a common voltage to the common electrode layer 330; and the sixth auxiliary reflecting electrode 1326 is electrically connected with the metal wiring layer 111 and the common electrode layer 330; such that the problems of too large slope and too large sinking depth of the common electrode layer 330 when the common electrode layer 330 is directly connected with the metal wiring layer 111 may be avoided, the manufacturing difficulty of the display panel may be reduced and the stability of the electrical connection between the metal wiring layer 111 and the common electrode layer 330 may be improved. Optionally, the pattern and the size of the sixth auxiliary reflecting electrode 1326 are the same as those of the first primary reflecting electrode 131, so as to improve an etching uniformity when the first reflecting electrode layer 130 is formed by etching.

Optionally, as shown in FIG. 1, the first insulating layer 200 is also provided with a plurality of connection via holes 202 in the cathode overlapping area E, and the connection via holes 202 in the cathode overlapping area E are arranged in one-to-one correspondence with the sixth auxiliary reflecting electrodes 1326. The connection via holes 202 may expose partial areas of the corresponding sixth auxiliary reflecting electrodes 1326. The second auxiliary reflecting electrode 312 may further include a plurality of seventh auxiliary reflecting electrodes 3127 in the cathode overlapping area E, and the seventh auxiliary reflecting electrode 3127 are arranged in one-to-one correspondence with the connection via hole 202 and the sixth auxiliary reflecting electrode 1326, so that the seventh auxiliary reflecting electrodes 3127 are electrically connected with the corresponding sixth auxiliary reflecting electrodes 1326 through the corresponding connection via holes 202. The common electrode layer 330 is electrically connected with each of the seventh auxiliary reflecting electrode 3127, so that the common electrode layer 330 is electrically connected with the metal wiring layer 111 through the seventh auxiliary reflecting electrode 3127 and the sixth auxiliary reflecting electrode 1326. Optionally, the pattern and the size of the seventh auxiliary reflecting electrode 3127 are the same as those of the second primary reflecting electrode 311, so as to improve an etching uniformity when the second reflecting electrode layer 310 is formed by etching.

In an embodiment of the present disclosure, as shown in FIGS. 1, 14 and 15, the peripheral area B may further include a first auxiliary area F between the display area A and the sensing area C, a second auxiliary area G between the sensing area C and the cathode overlapping area E, and a third auxiliary area H between the cathode overlapping area E and the bonding area D. The first auxiliary reflecting electrode 132 may also be located in the first auxiliary area F, the second auxiliary area G, and the third auxiliary area H. Optionally, patterns and sizes of the first auxiliary reflecting electrode 132 in the first auxiliary region F, the second auxiliary region G and the third auxiliary region H may be the same as those of the first primary reflecting electrode 131, so as to ensure an etching uniformity when forming the first reflecting electrode layer 130 by etching and improve a preparation accuracy of the first reflecting electrode layer 130. The second auxiliary reflecting electrode 312 may also be located in the first auxiliary area F, the second auxiliary area G and the third auxiliary area H. Optionally, patterns and sizes of the second auxiliary reflecting electrode 312 in the first auxiliary region F, the second auxiliary region G and the third auxiliary region G are the same as those of the second primary reflecting electrode 311, so as to ensure an etching uniformity when forming the second reflecting electrode layer 310 by etching and improve a preparation accuracy of the second reflecting electrode layer 310.

In an embodiment of the present disclosure, the distance between the two adjacent ones of the first auxiliary reflecting electrodes 132 is equal to the distance between the adjacent ones of the first primary reflecting electrodes 131. The distance between the two adjacent ones of the second auxiliary reflecting electrodes 312 is equal to the distance between the two adjacent ones of the second primary reflecting electrodes 311. In this way, uniformity of the first reflecting electrode layer 130 and the second reflecting electrode layer 310 may be further improved, and an etching uniformity of the first reflecting electrode layer 130 and the second reflecting electrode layer 310 may be further improved.

In another embodiment of the present disclosure, the distance between the two adjacent ones of the first auxiliary reflecting electrodes 132 is larger than the distance between the adjacent ones of the first primary reflecting electrodes 131. The distance between the two adjacent ones of the second auxiliary reflecting electrodes 312 is larger than the distance between the two adjacent ones of the second primary reflecting electrodes 311. The distance between the first auxiliary reflecting electrodes 132 is larger than the distance between the first primary reflecting electrodes, so that an area coverage of the first auxiliary reflecting electrodes 132 may be reduced, and a reflective ability of the peripheral area and reducing the influence of ambient light on a display effect of the display area A may be reduced. Therefore, the display panel provided by the present disclosure may achieve a better balance between improving the etching uniformity when forming the first reflecting electrode layer 130 and reducing an influence of ambient light on the display effect. The distance between the second auxiliary reflecting electrodes 312 is larger than the distance between the second primary reflecting electrodes 311, so that an area coverage of the second auxiliary reflecting electrodes 312 may be reduced, and a reflective ability of the peripheral area B and reducing the influence of ambient light on the display effect of the display area A may be reduced. Therefore, the display panel provided by the present disclosure may achieve a better balance between improving the etching uniformity when forming the second reflecting electrode layer 310 and reducing the influence of ambient light on the display effect.

In an embodiment of the present disclosure, as shown in FIGS. 1 and 15, the light-emitting device layer may further include a pixel definition layer 340. The pixel defining layer 340 is disposed on the surface of the first insulating layer 200 away from the driving back plate 100, and is located in a gap between the second primary reflecting electrodes 311. An orthographic projection of the pixel defining layer 340 on the first reflecting electrode layer 130 partially overlaps the first primary reflecting electrode 131. Since the pixel defining layer 340 is located in a gap between the second primary reflecting electrodes 311, the pixel defining layer 340 does not block the second primary reflecting electrodes 311, so that the display panel has a larger opening ratio and higher brightness. The pixel defining layer 340 is located between the second primary reflecting electrodes 311 and covers a part of the first primary reflecting electrodes 131, so that the light crosstalk between adjacent light-emitting devices and improve the contrast of the display panel may be reduced.

As shown in FIG. 1, the organic light-emitting layer 320 is disposed on the side of the second reflecting electrode layer 310 away from the driving circuit layer 110, and covers the sensing area C and the display area A, so that the electrical environment of the sensing device and the light-emitting device is uniform may be ensured and the accuracy of the simulation test results of the sensing area C may be improved. Optionally, materials of sub-film layers of the organic light-emitting layer 320 may be sequentially evaporated through an open mask, so that the sub-film layers are an integral film layer. In an embodiment of the present disclosure, the organic light-emitting layer 320 may be a white light emitting layer, so that the light-emitting device may emit white light. For example, the organic light-emitting layer 320 may include a red light-emitting material layer, a green light-emitting material layer and a blue light-emitting material layer, which are arranged in a stacked manner.

As shown in FIG. 1, the common electrode layer 330 is disposed on the surface of the organic light-emitting layer 320 away from the driving circuit layer 110, and may be made of transparent conductive material, such as magnesium-silver alloy. In an embodiment of the present disclosure, the common electrode layer 330 may also cover the cathode overlapping area E, to cover the surface of the seventh auxiliary reflecting electrode 3127 in the cathode overlapping area E away from the driving circuit layer 110, so as to realize the electrical connection with the metal wiring layer 111 through the seventh auxiliary reflecting electrode 3127.

As shown in FIG. 1, the display panel provided by the present disclosure may further include a thin film encapsulation layer (TFE) 410. The thin film encapsulation layer may cover one side of the common electrode layer 330 away from the driving circuit layer 110 and the side edge of the common electrode layer 330 to prevent moisture and oxygen from invading the organic light-emitting layer 320.

In an embodiment of the present disclosure, as shown in FIG. 1, the display panel provided by the present disclosure may further include a capping layer (CPL) 420. The capping layer 420 is disposed on the surface of the common electrode layer 330 away from the driving circuit layer 110, to improve the light emitting efficiency and further improve the brightness of the display panel.

In an embodiment of the present disclosure, as shown in FIG. 1, the display panel provided by the present disclosure may further include a color film layer 430. The color film unit may be disposed on a side of the thin film encapsulation layer 410 away from the driving circuit layer 110. The color film layer 430 may include color film units in different colors. The color film units in the display area A may be arranged in one-to-one correspondence with the second primary reflecting electrodes 311 in the display area A, so that the light emitted by the light-emitting device are emitted through the corresponding color film units, and the emitted light is filtered by the color film units to present color.

Furthermore, as shown in FIG. 1, the display panel may further include a black matrix layer 440. The black matrix layer 440 is disposed on the side of the thin film encapsulation layer 410 away from the driving circuit layer 110 and has a plurality of light transmission windows. The light-transmitting windows in the display area A are arranged in one-to-one correspondence with the second primary reflecting electrodes 311 in the display area A, and are covered by the color film units in the display area A in one-to-one correspondence. In the sensing area C, the black matrix layer 440 may not be provided with a light transmission window, so that the sensing devices in the sensing area C is covered by the black matrix layer 440. Therefore, the emitted light cannot be emitted even if the sensing device emits light.

Optionally, as shown in FIG. 1, the color film layer 430 and the black matrix layer 440 may be further provided with a protective layer 450 on a side away from the driving circuit layer 110. Optionally, the material and structure of the protective layer 450 are the same as those of the thin film encapsulation layer 410.

As shown in FIG. 1, the display panel provided by the present disclosure may further include a cover plate 460. The cover plate 460 is located on the other side of the display panel relative to the driving circuit layer 110, so that film layers such as the light-emitting device layer are located between the cover plate 460 and the driving circuit layer 110, so as to further protect the organic light-emitting layer 320 and improve the life and stability of the organic light-emitting layer 320. Optionally, the cover plate 460 may be a glass cover plate 460.

An embodiment of the present disclosure also provides a display device, which includes any one of the display panels as described in the embodiments concerning above-mentioned display panel. The display device may be AR glasses, VR glasses or other types of display devices. Since the display device has any one of the display panels as described in the above embodiments, it has the same beneficial effects, which will not be repeated herein.

It should be understood that this disclosure would never be limited to the detailed construction and arrangement of components as set forth in this specification. The present disclosure has other implementations that are able to be practiced or carried out in various ways. The foregoing variations and modifications fall within the scope of this disclosure. It should be understood that the present disclosure would contain all alternative combination of two or more individual features as mentioned or distinguished from in the text and/or in the drawings. All of these different combinations constitute a number of alternative aspects of the present disclosure. The implementations as illustrated in this specification are the best modes known to achieve the present disclosure and will enable the person skilled in the art to realize the present disclosure.

What is claimed is:

1. A display panel comprising a display area and a peripheral area surrounding the display area, the display panel comprising:
    a driving back plate comprising a driving circuit layer and a first reflecting electrode layer arranged in a stacked manner; the first reflecting electrode layer comprising a plurality of first primary reflecting electrodes in the display area and a plurality of first auxiliary reflecting electrodes in the peripheral area; and the plurality of first primary reflecting electrodes being electrically connected with the driving circuit layer;
    a first insulating layer on a side of the first reflecting electrode layer away from the driving circuit layer;
    a light-emitting device layer on a side of the first insulating layer away from the driving circuit layer and comprising a second reflecting electrode layer, an organic light-emitting layer and a common electrode layer sequentially stacked on a side of the first insulating layer away from the driving circuit layer; wherein the second reflecting electrode layer comprises a plurality of second primary reflecting electrodes in the display area and a plurality of second auxiliary reflecting electrodes in the peripheral area;
    wherein the plurality of second primary reflecting electrodes are in one-to-one correspondence with and electrically connected with the plurality of first primary reflecting electrodes; and
    wherein an orthographic projection of the second primary reflecting electrode on the first reflecting electrode layer is within the first primary reflecting electrode.

2. The display panel according to claim 1, wherein:
    the peripheral area comprises a sensing area;
    the plurality of first auxiliary reflecting electrodes in the sensing area have the same patterns with the plurality of first primary reflecting electrodes and are electrically connected with the driving circuit layer;
    the plurality of second auxiliary reflecting electrodes in the sensing area have the same patterns with the plurality of second primary reflecting electrodes and are electrically connected with the plurality of first auxiliary reflecting electrodes in the sensing area; and
    the sensing area is covered by the organic light-emitting layer and the common electrode layer.

3. The display panel according to claim 1, wherein:
    a minimum value of a distance between any point of the orthographic projection of the second primary reflecting electrode on the first reflecting electrode layer and any point on an edge of the first primary reflecting electrode is a first distance;

a minimum value of a distance between any point of an edge of the second primary reflecting electrode and a center of the second primary reflecting electrode is a first dimension value; and the first distance is within a range of 13%-17% of the first dimension value.

4. The display panel according to claim 1, wherein a minimum value of a distance between any point of orthographic projection of the second primary reflecting electrode on the first reflecting electrode layer and any point on an edge of the first primary reflecting electrode is equal to 0.2-0.5 microns.

5. The display panel according to claim 1, wherein:
a distance between two adjacent ones of the plurality of first primary reflecting electrodes is a second distance;
a minimum value of a distance between any point on edge of the first primary reflecting electrode and a center of the first primary reflecting electrode is a second dimension value; and
the second distance is within a range of 7%-10% of the second dimension value.

6. The display panel according to claim 1, wherein a distance between two adjacent ones of the plurality of first primary reflecting electrodes is equal to 0.1-0.3 microns.

7. The display panel according to claim 1, wherein:
a minimum value of a distance between any point on an edge of the second primary reflecting electrode and a center of the second primary reflecting electrode is a first dimension value;
a distance between two adjacent ones of the plurality of second primary reflecting electrodes is a third distance; and
the third distance is within a range of 30% to 50% of the first dimension value.

8. The display panel according to claim 1, wherein a distance between two adjacent ones of the plurality of second primary reflecting electrodes is equal to 0.6-1.0 microns.

9. The display panel according to claim 1, wherein the second reflecting electrode layer comprises a first titanium metal layer, a first aluminum metal layer, a second titanium metal layer and a molybdenum metal layer sequentially stacked on a surface of the first insulating layer away from the driving circuit layer; wherein the first titanium metal layer has a thickness of 80-120 angstroms, the first aluminum metal layer has a thickness of 400-500 angstroms, the second titanium metal layer has a thickness of 40-60 angstroms, and the molybdenum metal layer has a thickness of 40-60 angstroms.

10. The display panel according to claim 1, wherein the first reflecting electrode layer comprises a third titanium metal layer, a second aluminum metal layer, and a titanium nitride layer sequentially stacked on a side of the driving circuit layer; wherein the third titanium metal layer has a thickness of 80-120 angstroms, the second aluminum metal layer has a thickness of 700-900 angstroms, and the titanium nitride layer has a thickness of 80-120 angstroms.

11. The display panel according to claim 1, wherein an orthographic projection of a center of the second primary reflecting electrode on the first reflecting electrode layer overlaps a center of the first primary reflecting electrode.

12. The display panel according to claim 1, wherein:
the peripheral area comprises a bonding area;
an auxiliary reflecting electrode in the bonding area is electrically connected with the driving circuit layer; and
the first insulating layer has a bonding hole exposed at least a part of the auxiliary reflecting electrode in the bonding area.

13. The display panel according to claim 1, wherein:
the light-emitting device layer further comprises a pixel definition layer;
the pixel definition layer is on a surface of the first insulating layer away from the driving back plate and located in a gap between the plurality of second primary reflecting electrodes; and
an orthographic projection of the pixel definition layer on the first reflecting electrode layer partially overlaps the first primary reflecting electrode.

14. The display panel according to claim 1, wherein:
a distance between two adjacent ones of the plurality of first auxiliary reflecting electrodes is larger than a distance between two adjacent ones of the plurality of first primary reflecting electrodes; and
a distance between two adjacent ones of the plurality of second auxiliary reflecting electrodes is larger than a distance between two adjacent ones of the plurality of second primary reflecting electrodes.

15. The display panel according to claim 1, wherein a light transmittance of the first insulating layer is not less than 70%.

16. The display panel according to claim 1, wherein:
a second insulating layer is between the driving circuit layer and the first reflecting electrode layer; the second insulating layer is provided with a plurality of second via holes, and second metal connectors are disposed within the second via holes respectively;
the plurality of first primary reflecting electrodes are electrically connected with the driving circuit layer through the second metal connectors;
the first insulating layer has a plurality of connection via holes that are in one-to-one correspondence with the plurality of first primary reflecting electrodes; and a partial surface of the first primary reflecting electrode is exposed out of the connection via hole;
the plurality of second primary reflecting electrodes are in one-to-one correspondence with the plurality of first primary reflecting electrodes respectively and are electrically connected with the plurality of first primary reflecting electrodes through connection via holes;
an orthographic projection of the connection via hole on the second reflecting electrode layer is located within the second primary reflecting electrode; a minimum value of a distance between any point of the orthographic projection of the connection via hole on the second reflecting electrode layer and any point on an edge of the second primary reflecting electrode is not less than a first threshold value; and
the first threshold value is between 0.13-1.3 times of a distance between two adjacent ones of the plurality of second primary reflecting electrodes.

17. The display panel according to claim 16, wherein a minimum value of a distance between any point of the orthographic projection of the connection via hole on the second reflecting electrode layer and any point on an edge of the second primary reflecting electrode is equal to the first threshold value.

18. The display panel according to claim 16, wherein the second primary reflecting electrode has at least a first edge and a second edge adjacent to each other; a minimum value of a distance between any point of the orthographic projection of the connection via hole on the second reflecting electrode layer and any point of the first edge of the second primary reflecting electrode is equal to the first threshold value; and a minimum value of a distance between any point of the orthographic projection of the connection via hole on the second reflecting electrode layer and any point on the second edge of the second primary reflecting electrode is equal to the first threshold value.

19. The display panel according to claim 16, wherein:
a minimum value of a distance between any point on edge of the second primary reflecting electrode and a center of the second primary reflecting electrode is a first dimension value; and
the first threshold value is within a range of 5%-8% of the first dimension value.

20. The display panel according to claim 16, wherein an orthographic projection of the second metal connector electrically connected to the second primary reflecting electrode on the second reflecting electrode layer is located within the second primary reflecting electrode and does not completely overlap the orthographic projection of the connection via holes on the second reflecting electrode layer.

21. The display panel according to claim 20, wherein:
a minimum value of a distance between any point of the orthographic projection of the connection via hole on the second reflecting electrode layer and any point on the edge of the second primary reflecting electrode is equal to a fourth distance;
a minimum value of a distance between any point of the orthographic projection of the second metal connector on the second reflecting electrode layer and any point on the edge of the second primary reflecting electrode electrically connected with the second metal connector is equal to fifth distance; and
the fifth distance is smaller than the fourth distance.

22. The display panel according to claim 16, wherein:
the orthographic projection of the second metal connector on the second reflecting electrode layer is within the plurality of second primary reflecting electrodes electrically connected with the second metal connector; and
a minimum value of the distance between any point of the orthographic projection of the second metal connector on the second reflecting electrode layer and any point on the edge of the plurality of second primary reflecting electrodes electrically connected with the second metal connector is not greater than a second threshold; and
the second threshold is smaller than the first threshold.

23. The display panel according to claim 16, wherein:
an orthographic projection of the second primary reflecting electrode on the driving circuit layer are centrally symmetric hexagons, and the plurality of second primary reflecting electrodes are arranged in a honeycomb shape;
the plurality of second primary reflecting electrodes form a plurality of second primary reflecting electrode rows arranged in a row direction;
the second primary reflecting electrode comprises two first side walls oppositely arranged and four second side walls connected with the two first side walls;
the two first side walls are perpendicular to the row direction and the four second side walls enclose a first apex angle and a second apex angle oppositely arranged; and
minimum values of distances between any point of an orthographic projection of the connection via hole on the second primary reflecting electrode and any points of two second side walls of the first apex angle of the second primary reflecting electrode are respectively equal to the first threshold value.

24. The display panel according to claim 23, wherein the orthographic projections of the second metal connectors on the plurality of second primary reflecting electrodes in the second primary reflecting electrode row are alternately arranged.

25. The display panel according to claim 24, wherein the orthographic projections of the second metal connectors on the plurality of second primary reflecting electrodes in the second primary reflecting electrode row are arranged in a row.

26. The display panel according to claim 16, wherein a diameter of the connection via hole is 0.2-0.4 microns.

27. A display device comprising the display panel according to claim 1.

* * * * *